United States Patent [19]

Suda

[11] Patent Number: 5,710,744
[45] Date of Patent: Jan. 20, 1998

[54] TIMING GENERATOR FOR IC TESTERS

[75] Inventor: Masakatsu Suda, Ageo, Japan

[73] Assignee: Advantest Corporation, Tokyo, Japan

[21] Appl. No.: 652,344

[22] Filed: May 23, 1996

[30] Foreign Application Priority Data

May 26, 1995 [JP] Japan .................................. 7-127883

[51] Int. Cl.$^6$ .............................. G04F 8/00; H03K 5/135; G06F 11/00
[52] U.S. Cl. .................. 368/120; 327/273; 327/279; 371/27
[58] Field of Search ................ 368/10, 113, 118–120; 327/158–161, 265, 273, 279, 286; 371/22.1, 27

[56] References Cited

U.S. PATENT DOCUMENTS

| | | | |
|---|---|---|---|
| 5,142,223 | 8/1992 | Higashino et al. | 371/22.1 |
| 5,321,700 | 6/1994 | Brown et al. | 371/27 |
| 5,488,325 | 1/1996 | Sato et al. | 327/286 |

*Primary Examiner*—Vit W. Miska
*Attorney, Agent, or Firm*—Staas & Halsey

[57] ABSTRACT

Output pulses of a period which is an integral multiple of the fundamental period T are generated by coarse timing generating means 13 in correspondence with an integral part Di of timing set data read out of a memory 11, and the output pulses are distributed by distributing means 17 to set- and reset-side delay means 26s and 26r under the control of a waveform generation control circuit 18. Pieces of data Dr and Ds, which are obtained by adding a fractional part of the timing set data read out of the memory and set-side skew absorbing data and reset-side skew absorbing data, respectively, are provided as delay control signals to the set- and reset-side delay means 26s and 26r. The pulse distributed to the set-side delay means 26s is delayed by logical delay means 27s for any one of delay times 0, 1T and 2T in accordance with the integral value of the data Ds, and the thus delayed pulse is further delayed by fine delay means 28s in accordance with the fractional value of the data Ds. Similarly, the pulse distributed to the reset-side delay means 26r is delayed by logical delay means 27r in accordance with the integral value of the data Dr and then delayed by fine delay means 28r in accordance with the fractional value of the data Dr. The outputs from the fine delay means 28s and 28r are applied to a flip-flop 25 to set and reset it to generate the waveform of a desired pattern.

7 Claims, 6 Drawing Sheets

1

TIMING GENERATOR FOR IC TESTERS

BACKGROUND OF THE INVENTION

The present invention relates to a timing generator for IC testers which is provided for each pin of an IC device under test to generate the timing for the formation of waveforms of various patterns that are supplied to the IC device under test.

FIG. 1 illustrates in block form a conventional timing generator indicated generally by 10. In a period memory 11 of the timing generator 10 there are separately stored integral and fractional parts Di and Df of timing set data expressed in terms of the fundamental period (T). The integral and fractional parts Di and Df of the timing set data will hereinafter be referred to simply as integral and fractional data, respectively. The stored contents of the period memory 11 are sequentially read out every test cycle. The timing set data thus read out of the period memory 11 is stored in a set data register 12. The integral data Di of the timing set data in the register 12 is input into coarse timing generating means 13. The coarse timing generating means 13 is supplied with clock pulses of the fundamental period T from a stable clock generator 15 and supplies fine delay means 16 with pulses of a period corresponding to an integral multiple of the fundamental period T, that is, a period corresponding to the integral data Di. The coarse timing generating means 13 is disclosed in, for example, U.S. Pat. No. 5,491,673 issued Feb. 13, 1996. The fine delay means 16 is being supplied with the fractional data Df and delays each input pulse for a period of time corresponding to the data Df. The output pulses from the fine delay means 16, that is, the pulses of the period corresponding to the set data, are distributed by distributing means 17 or gates 17a and 17b to set and reset sides in accordance with the output from a waveform generation control circuit 18. The waveform generation control circuit 18 is described in, for instance, Japanese Patent Laid-Open Gazette No. 4185/91 (issued Jan. 10, 1991). The pulse thus distributed by the distributing means 17 to the set side is fed to what is called skew absorbing delay means 21 which compensates for variations in the propagation delay over the set-side propagation path from the timing generator 10 to an IC device under test (hereinafter referred to simply as DUT) 19. The pulse distributed to the reset side is fed to skew absorbing delay means 22 which similarly compensates for variations in the propagation delay over the reset-side propagation path from the timing generator 10 to the DUT 19. That is, the skew absorbing delay means 21 and 22 delay the input pulses thereto in accordance with propagation delay variation compensating data (skew absorbing data) stored in registers 23 and 23, respectively. A flip-flop 25 is set and reset by output pulses from the skew absorbing delay means 21 and 22, and the output from the flip-flop 25 is applied to one pin of the DUT 19 via a driver not shown. Though not shown, the timing generator depicted in FIG. 1 is provided for each input pin or input/output pin of the DUT 19.

As described previously herein, the period memory 11 is read out every test cycle, that is, the timing generator 10 has a configuration in which the period of the pulse by the timing generator 10 can be changed every test cycle. On the other hand, the delay control by the skew absorbing delay means 21 and 22 is not real-time delay control, but instead the propagation delay in each propagation path is measured at proper times and data for compensating for variations in the propagation delay is created and set in the corresponding one of the registers 23 and 24.

In the conventional timing generator, the fine delay means 16 and the skew absorbing delay means 21 and 22 are so configured as to permit fine delay control; each delay means is formed by a cascade connection of circuits which determine whether to permit or inhibit the passage of the input signal through; for example, a buffer in the IC device through utilization of the propagation delay in the buffer. Additionally, the fine delay means 16 needs to be able to delay the input thereto for various periods of time up to the fundamental period T in correspondence with required high accuracies. The skew absorbing delay means 21 and 22 are each required to delay the input thereto for various periods of time up to about three times longer than the fundamental period T, and their delay accuracy needs to be about the same as that of the fine delay means 16. To meet this requirement, the skew absorbing delay means 21 and 22 also have the same configuration as that of the fine delay means 16. In such a delay circuit that utilizes the propagation delay of a buffer, the delay time varies with changes in the power supply voltage and the clock speed, is susceptible to the influence of temperature and largely scatters according to production lots. The accuracy of the delay could be increased by providing a cascade connection of many delay circuits, but the delay time throughout it is readily affected by the above-mentioned factors and the circuits are subject to external noise. The prior art requires as many as three such delay means for each propagation path—this deteriorates the accuracy of IC testing accordingly. Incidentally, while in the above the delay means 16, 21 and 22 are described to utilize the delay in the buffer, they may also be implemented, for instance, by connecting and disconnecting an electrostatic capacitive element to and from each signal propagation path to change the delay time but the above-mentioned problems still remain unsolved.

SUMMARY OF THE INVENTION

It is therefore an object of the present invention to provide a timing generator for IC testers which is free from the above-mentioned defects of the prior art.

According to a first aspect of the present invention, pulses from coarse timing generating means are distributed by distributing means to the set- and the reset-sides in accordance with the output from a waveform generation control circuit, and the pulses distributed to the set- and reset-sides are then fed to set-side delay means and reset-side delay means, respectively. The set-side delay means delays the input pulse thereto by a time interval corresponding to the sum of a fractional part of timing set data and set-side propagation delay variation compensating data or what is called skew absorbing data, whereas the reset-side delay means delays the input pulse thereto by a time interval corresponding to the sum of a fractional part of the timing set data and reset-side skew absorbing data.

According to a second aspect of the present invention, the pulses from the coarse timing generating means are fed to set-side and reset-side delay means, respectively. The set-side and reset-side delay means are each identical in construction with the counterpart in the first aspect. The output pulses from the set- and reset-side delay means are applied to gate means which permit or inhibit the passage therethrough of the pulses under the control of set- and reset-side outputs from the waveform generation control circuit.

The set-side delay means in either aspect of the invention comprises logical delay means for delaying the input pulse thereto by a time interval which is an integral multiple of the fundamental period corresponding to the integral part of the set-side added data, and fine delay means for delaying the output pulse from the logical delay means by a time interval corresponding to the fractional part of the set-side added data. Similarly, the reset-side delay means in either aspect of the invention comprises logical delay means for delaying the input pulse thereto by a time interval which is an integral multiple of the fundamental period corresponding to the integral part of the reset-side added data, and fine delay means for delaying the output pulse from the logical delay means by a time interval corresponding to the fractional part of the reset-side added data.

The set-side and reset-side added data may be stored in a memory together with timing set data, or they may be obtained by adding the fractional part of the timing set data read out of a memory and the set- and reset-side propagation delay variation compensating data, respectively.

On account of such a configuration as mentioned above, a single fine delay means needs only to be provided in each of the set- and reset-side delay means, and the maximum delay time of the fine delay means can be limited to the fundamental period.

DESCRIPTION OF THE PREFERRED EMBODIMENTS

Figure 1:
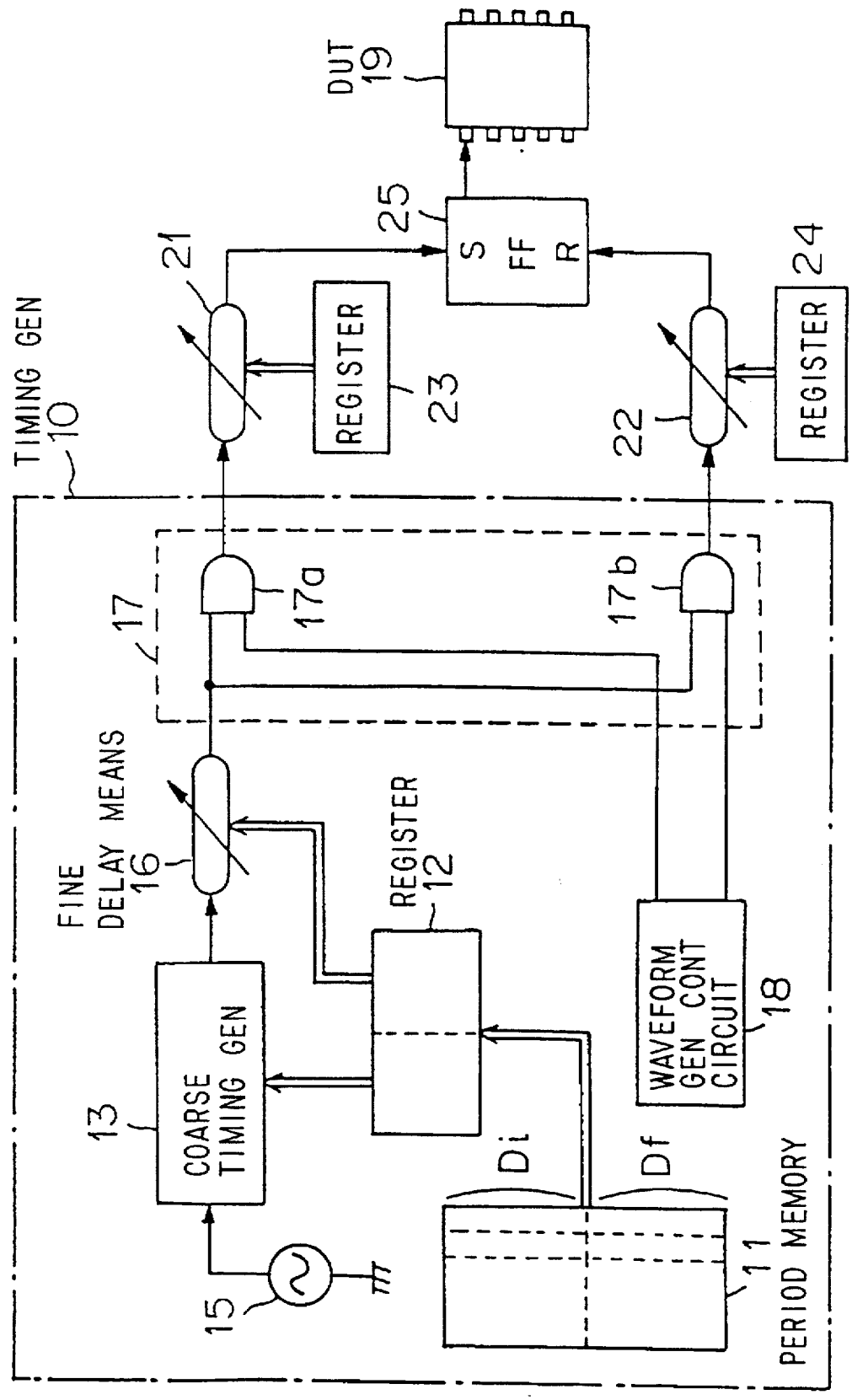
FIG. 1 a block diagram showing a conventional timing generator.
Figure 2:
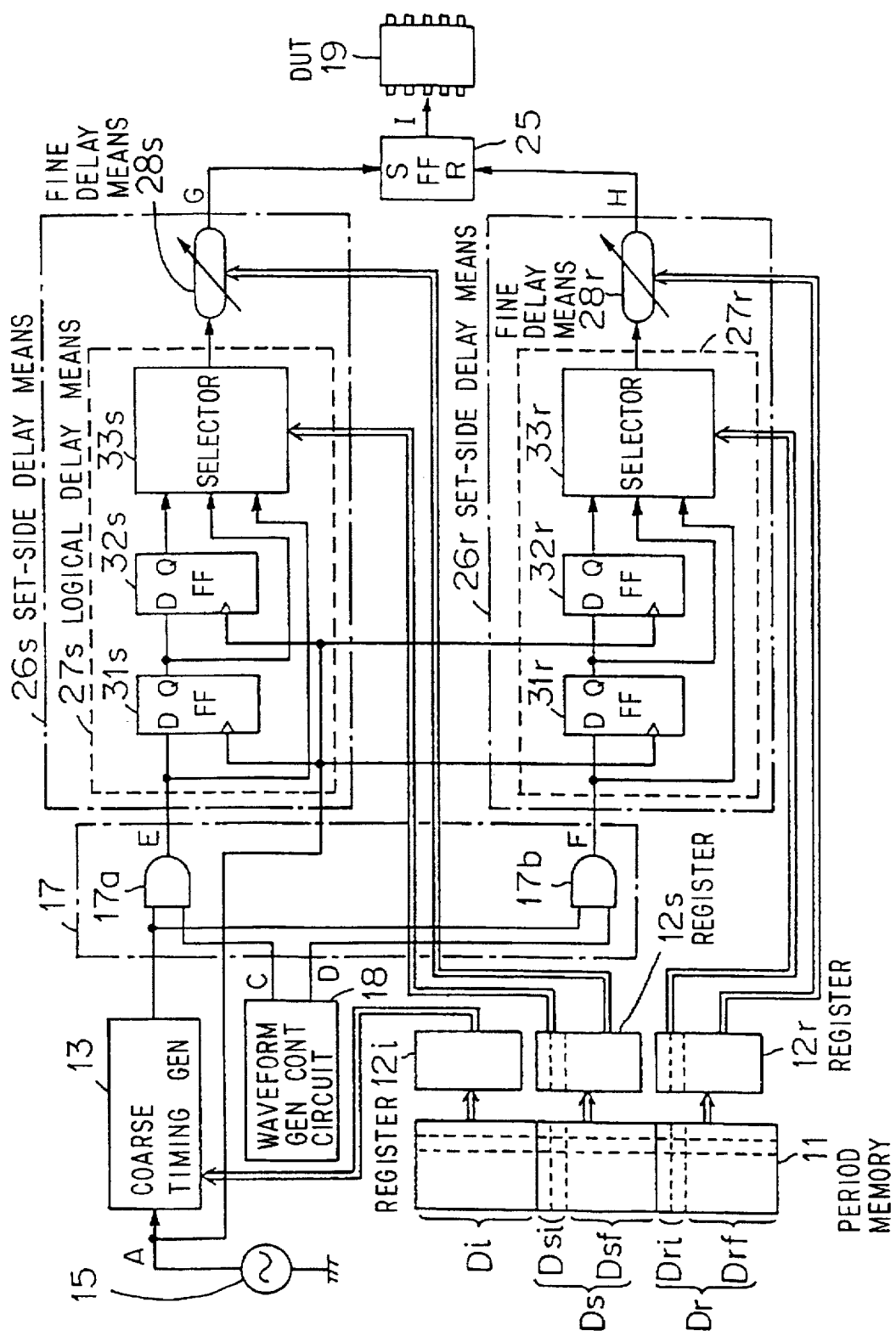
FIG. 2 is a block diagram illustrating an embodiment according to the first aspect of the present invention.

In FIG. 2 there is illustrated in block form an embodiment of the present invention, in which the parts corresponding to those in FIG. 1 are identified by the same reference numerals. In this embodiment, the timing set data expressed in terms of the fundamental period T is stored in the period memory 11 as in the prior art. The integral data Di (the integral part) in the set data is stored intact, and data Ds obtained by adding the fractional data in the timing set data and the set-side skew absorbing data and data Dr obtained by adding the fractional data in the timing set data and the reset-side skew absorbing data are stored separately of each other. The set-side data Ds is composed of integral data Dsi which results from the addition, or because of the skew absorbing data itself exceeding the fundamental period T, and fractional data Dsf. Likewise, the reset-side data Dr is composed of integral data Dri and fractional data Drf. These pieces of integral data Dsi and Dri are both two-bit data. The period memory 11 is read every test cycle and the integral data Di in the read-out data is stored in a register 12i, from which it is fed to the coarse timing generating means 13 as in the prior art. The set-side data Ds is stored in a register 12s and the reset-side data Dr in a register 12r.

The coarse timing generating means 13 generates pulses of a period which is an integral multiple of the fundamental period T corresponding to the data Di set in the same manner as in the prior art, and in this embodiment the output pulses are distributed first by the distributing means 17 to the set- and reset-sides under the control of the output from the waveform generation control circuit 18 and then fed to set- and reset-side delay means 26s and 26r, respectively. The set-side delay means 26s is made up of logical delay means 27s which is supplied with the set-side pulse distributed by the distributing means 17 and fine delay means 28s which is supplied with the output from the logical delay means 27s.

The logical delay means 27s is formed by logic circuits and delays the input pulse thereto by a time interval corresponding to the integral data Dsi stored in the register 23s. The fine delay means 28s delays the input pulse by a time interval corresponding to the fractional data Dsf stored in the register 23s. The logical delay means 27s comprises a cascade connection of D flip-flops 31s and 32s and a selector 33s, the flip flop 31s having its input and output connected to the input of the selector 33s and the flip-flop 32s having its output connected to the input of the selector 33s. The selector 33s selects one of the three inputs thereto in accordance with the integral data Dsi. That is, when the data integral Dsi is "0," the input pulse is fed directly to the fine delay means 28s without the passage through the flip-flops 31s and 32s; when the data Dsi is "1," the output from the flip-flop 31s or a pulse delayed for one fundamental period T is fed to the fine delay means 28s; and when the data Dsi is "2," the output from the flip-flop 32s or a pulse delayed for two fundamental periods (2T) is fed to the fine delay means 28s. Incidentally, the flip-flops 31s and 32s are each triggered by the clock pulse from the clock generator 15.

The reset-side delay means 26r is also identical in construction with the set-side delay means 26s. The reset-side delay means 26r comprises logical delay means 27r and fine delay means 28r. The logical delay means 27r is made up of a two-stage delay circuits formed by flip-flops 31r and 32r which are supplied with the reset-side pulse distributed by the distributing means 17 and are triggered by the clock pulse from the clock generator 15, and a selector 33r which selects one of a pulse having not passed through the both flip-flops 31r and 32r, a pulse having passed through the flip-flop 31r and a pulse having passed through the both flip-flops 32r and 32r, that is, one of a non-delayed pulse, a pulse delayed for one fundamental period (T) and a pulse delayed for two fundamental periods (2T). The selector 33r is selectively controlled by the integral data Dri stored in the register 12r and the output from the selector 33r is applied to the fine delay means 28r. The output pulses from the fine delay means 28s and 28r are provided to the flip-flop 25 to set and reset it.

With such an arrangement as described above, the set-side delay means 26s delays the input pulse thereto by a time interval corresponding to the sum of the fractional data in the timing set data and the set-side skew absorbing data, whereas the reset-side delay means 26r delays the input pulse thereto by a time interval corresponding to the sum of the fractional data in the timing set data and the reset-side skew absorbing data. Consequently, the output from the flip-flop 25 becomes the same as the output from the flip-flop 25 in FIG. 1; in addition, the maximum delay by each of the fine delay means 28s and 28r needs only to be the fundamental period T, and since the logical delay means 27s and 27r are each formed by logic circuits, their delay is not readily affected by external disturbances such as supply voltage or temperature variations. Moreover, only two fine delay means are needed which are susceptible to external influences, and the maximum value of their delay is smaller than that of the conventional skew absorbing delay means—this permits reduction of the scale of the fine delay means as a whole.

Figure 3:
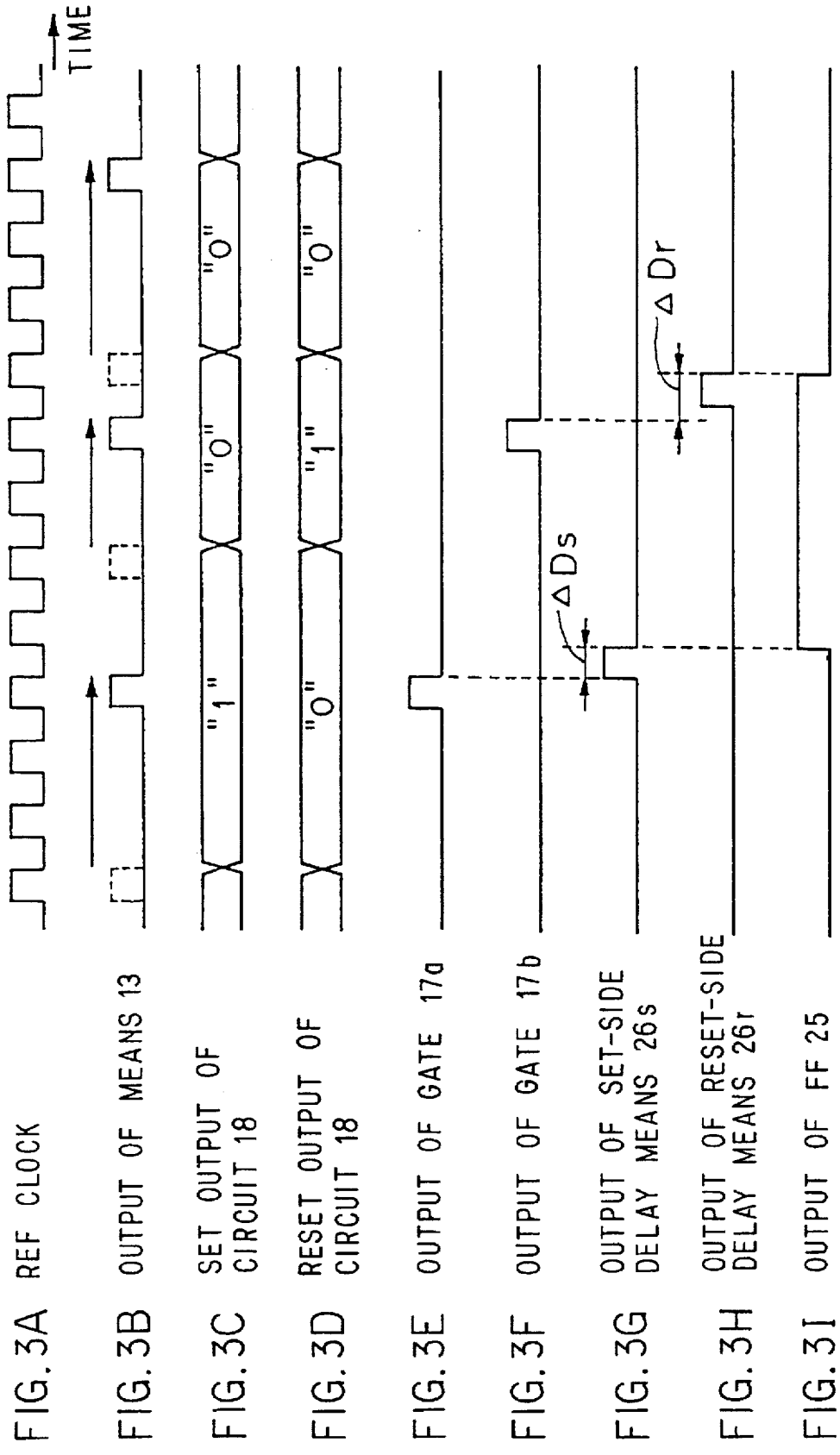
FIGS. 3A through 3I are timing charts showing waveforms occurring at various parts during the operation of the timing generator depicted in FIG. 2.

In FIG. 3 there is shown an example of the operation of the FIG. 2 embodiment. FIG. 3A shows a reference clock pulse from the clock generator 15 and FIG. 3B the output pulse from the coarse timing generating means 13, which has a period that is an integral multiple of the reference clock corresponding to the integral data Di. The broken-line pulses each indicate the beginning of the test cycle, and the coarse timing generating means 13 generates pulses delayed behind them by a time interval corresponding to the integral data Di. The set- and reset-side outputs from the waveform generation control circuit 18 are high ("1") or low ("0") as shown in FIG. 3C and D, and gates 17a and 17b are enabled or disabled depending on whether the input thereto from the waveform generation control circuit 18 is high ("1") or low ("0"). Hence, in the example of FIG. 3 the pulses distributed to the set- and reset-sides are alternately taken out as the output pulses from the coarse timing generating means 13 as shown in FIGS. 3E and F, respectively. These distributed pulses are delayed by the set- and reset-side delay means 26s and 26r for ΔDs and ΔDr relative to the set- and reset-side pulses as shown in FIGS. 3G and H, respectively. These delayed pulses are applied to the flip-flop 25 to set and reset it, and its output waveform is such as depicted in FIG. 3I.

Figure 4:
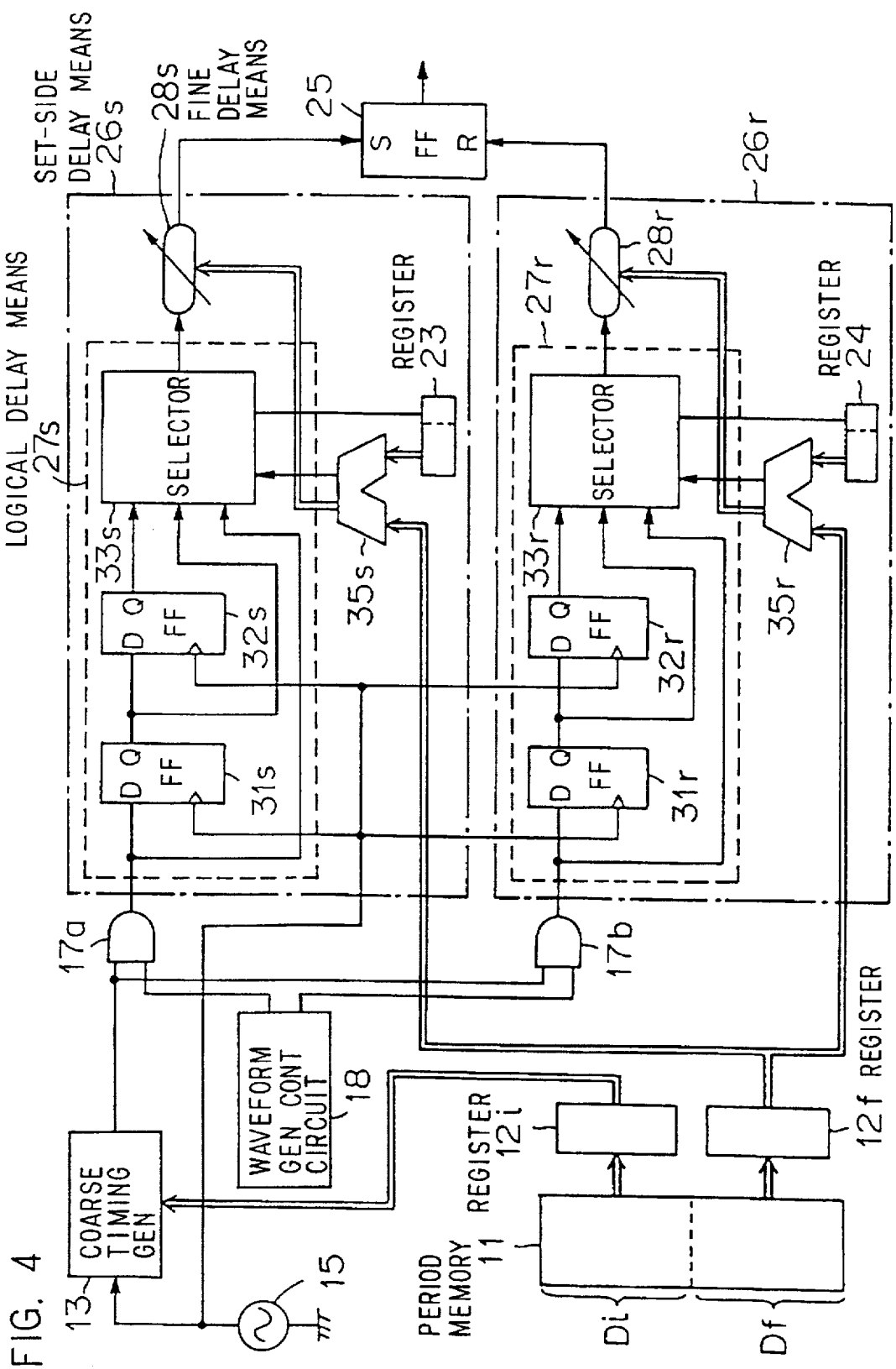
FIG. 4 is a block diagram illustrating another embodiment according to the first aspect of the present invention.

FIG. 4 illustrates in block form another embodiment of the present invention, in which the parts corresponding to those in FIGS. 1 and 2 are identified by the same reference numerals. In the period memory 11 there is stored the same data as that in FIG. 1; namely, the integral data Di in the data read out of the period memory 11 is stored in the register 12i and the fractional data Df is stored in the register 12f. The output pulses from the coarse timing generating means 13 are distributed to either one of the set- and reset-side delay means 26s and 26r under the control of the output from the waveform generation control circuit 18. The delay means 26s and 26r each have logical delay means 27 and fine delay means 28 as is the case with the FIG. 2 embodiment in this embodiment, the set-side delay means 26s further has an adder 35s for adding together the fractional data in the timing set data, that is, the fractional data Df read out of the register 12f, and the set-side skew absorbing data from the register 23, that is, the set-side propagation delay compensating data. The fractional data in the adder output is provided as the timing set data to the fine delay means 28s, and at the same time, the carry output from the adder 35s and the integral data in the register 23 are fed as control data to the selector 33s to control it in the same manner as is the case with the control data for the selector 33s in FIG. 2. In other words, the selector 33s is controlled by the integral data in the value obtained by adding the fractional data Df and the set-side skew absorbing data; when the integral data is "0," the pulse distributed to the set-side is applied directly to the fine delay means 28s; when the integral data is "1," the output from the flip-flop 31s is applied to the fine delay means 28s; and when the integral data is "2," the output from the flip-flop 32s is fed to the fine delay means 28s.

The reset-side delay means 26r also has an adder 35r, by which the fractional data Df and the reset-side skew absorbing data from the register 24 are added together. The fractional data is used to control the fine delay means 28r, and a carry signal of the adder 35r and the integral data in the register 24 are used to control the selector 33r. This embodiment is identical in construction and operation with the FIG. 2 embodiment except the above.

Figure 5:
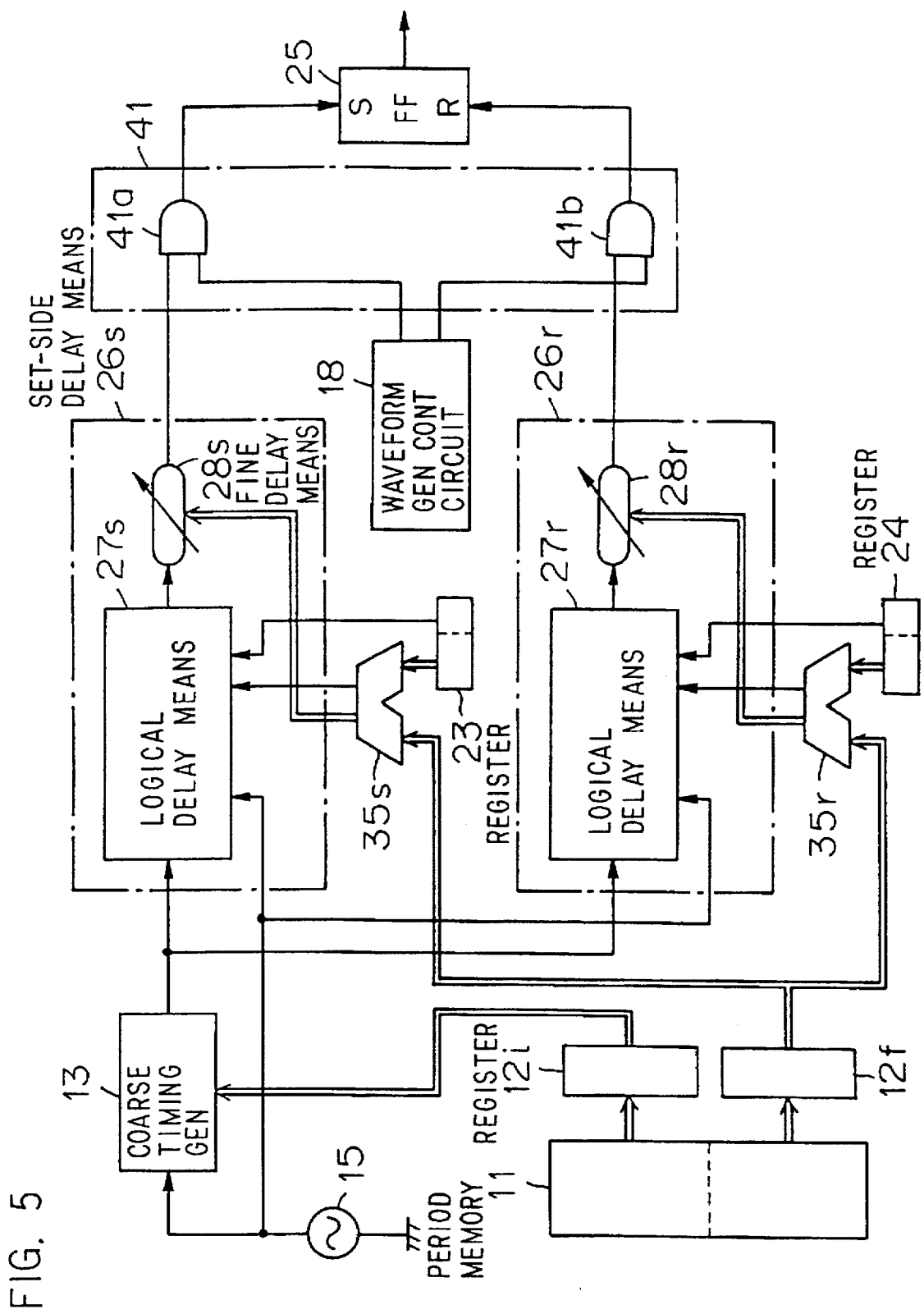
FIG. 5 is a block diagram illustrating an embodiment according to the second aspect of the present invention.
Figure 6:
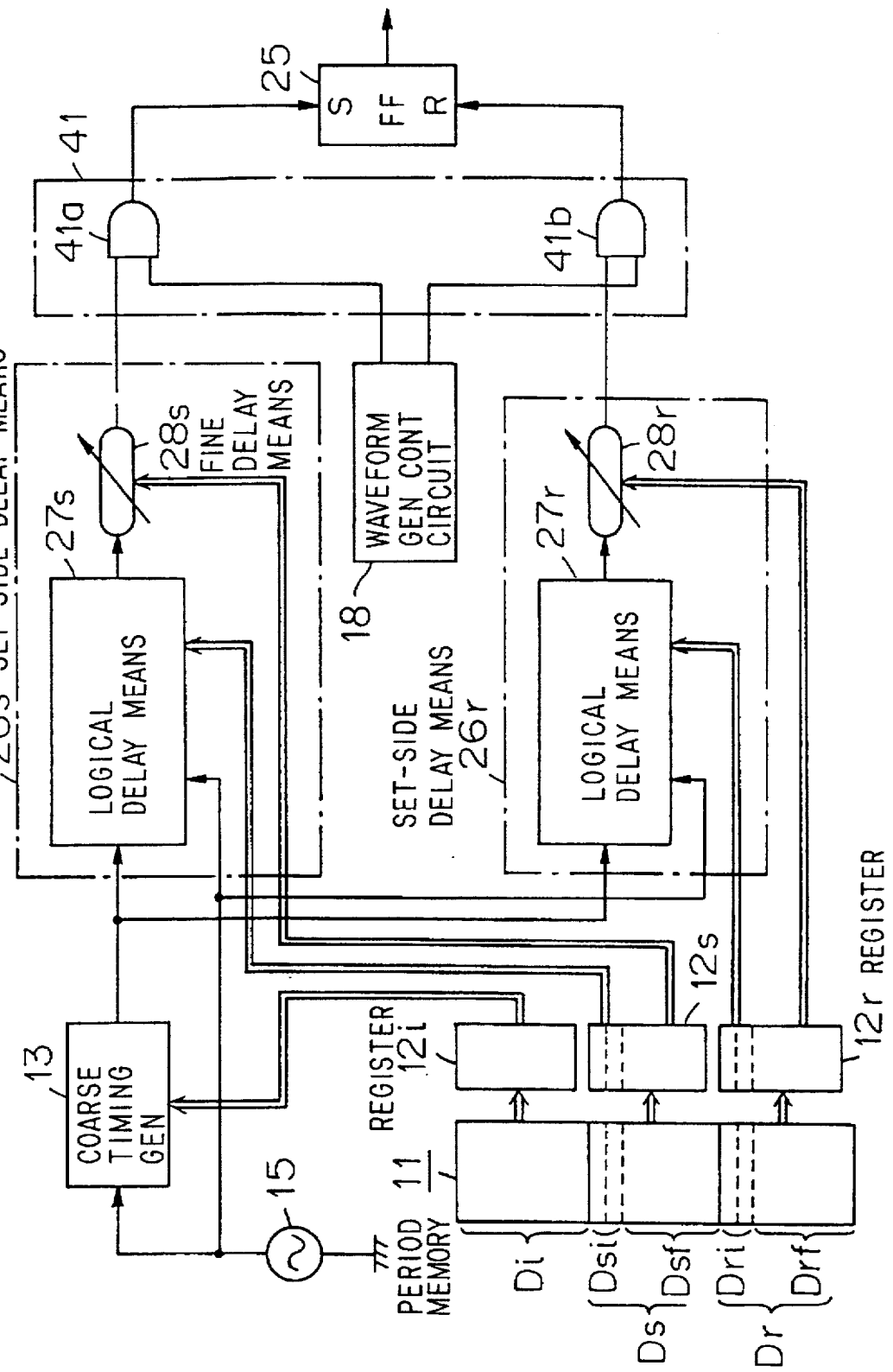
FIG. 6 is a block diagram illustrating another embodiment according to the second aspect of the present invention.

FIG. 5 illustrates in block form a modification of the FIG. 4 embodiment, in which the parts corresponding to those in FIG. 4 are identified by the same reference numerals. In this embodiment the distributing means 17 is removed from the pre-stage of the logical delay means, the output pulse from the coarse timing generating means 13 is applied directly to the logical delay means 27s and 27r, and the outputs from the fine delay means 28s and 28r are fed to gates 41a and 41b of gate means 41, respectively. The gates 41a and 41b are enabled and disabled by the set- and reset-side outputs from the waveform generation control circuit 18, and the outputs from the gates 41a and 41b are applied to the flip-flop 25 to set and reset it. FIG. 6 also illustrates in block form a modification of the FIG. 2 embodiment, in which the distributing means 17 is omitted and the gate means 41 is provided at the post-stage of each of the set- and reset-side delay means 26s and 26r.

As described above, according to the present invention, the pulses from the coarse timing generating means 13 are applied to the set- and reset-side delay means, wherein the set- and reset-side pulses are each delayed by a time interval corresponding to the fractional data in the timing set data and the skew absorbing data. Since in this instance the delay corresponding to the integral data in the timing set data is provided by the logical delay means 27s and 27r, the fine delay means needs only to provide delays up to the fundamental period T. While the prior art requires three fine delay means, one for providing delays up to the fundamental period T and two for providing delays up to about two fundamental periods, the present invention requires two fine delay means and their delay times are also shorter than in the prior art. The logical delay means are provided at the set- and reset-sides and they are not readily affected by supply voltage and temperature changes and by noise. The fine delay means is not susceptible to the influence of external disturbances and noise because their maximum delay time is short. In particular, the embodiments of FIGS. 2 and 4 are more robust against temperature changes of the gate means 41 than the embodiments of FIGS. 5 and 6.

It will be apparent that many modifications and variations may be effected without departing from the scope of the novel concepts of the present invention.

I claim:

1. A timing generator for IC testers which is provided for each pin of an IC device under test, comprising:

coarse timing generating means for generating pulses of a period which is an integral multiple of a fundamental period corresponding to an integral part of timing set data expressed in terms of said fundamental period;

distributing means for distributing said pulses to set- and reset-sides in accordance with the output from a waveform generation control circuit;

set-side delay means for delaying said pulse distributed to said set-side by a time interval corresponding to data obtained by adding a fractional part of said timing set data and data which is generated at a post-stage of said timing generator for compensating for set-side propagation delay variations; and reset-side delay means for delaying said pulse distributed to said reset-side by a time interval corresponding to data obtained by adding said fractional part of said timing set data and data which is generated at said post-stage of said timing generator for compensating for reset-side propagation delay variations.

2. The timing generator of claim 1, further comprising:

a memory which stores said integral part of said timing set data, said set-side added data and said reset-side added data and is read every test cycle, said integral part read out of said memory being provided to said coarse timing generating means;

wherein said set-side delay means comprises set-side logical delay means for delaying the input pulse thereto by a time interval corresponding to an integral multiple of said fundamental period in accordance with an integral part of said set-side added data read out of said memory, and fine delay means for delaying the output pulse from said set-side logical delay means by a time interval shorter than said fundamental period corresponding to a fractional part of said read-out set-side added data; and wherein said reset-side delay means comprises reset-side logical delay means for delaying the input pulse thereto by a time interval corresponding to an integral multiple of said fundamental period in accordance with an integral part of said reset-side added data read out of said memory, and fine delay means for delaying the output pulse from said reset-side logic delay means by a time interval shorter than said fundamental period corresponding to a fractional part of said read-out reset-side added data.

3. The timing generator of claim 1, further comprising:

a memory in which said integral and fractional parts of said timing set data are stored separately and from which they are read out every test cycle, said read-out integral part being provided to said coarse timing generating means;

wherein said set-side delay means comprises a set-side adder for adding a fractional part of said read-out set data and said set-side propagation delay variation compensating data, set-side logical delay means for delaying the input pulse thereto by a time interval which is an integral multiple of said fundamental period corresponding to an integral part of said set-side added data, and fine delay means for delaying the output pulse from said set-side logical delay means by a time interval shorter than said fundamental period corresponding to a fractional part of said set-side added data; and wherein said reset-side delay means comprises a reset-side adder for adding a fractional part of said read-out set data and said reset-side propagation delay variation compensating data, reset-side logical delay means for delaying the input pulse thereto by a time interval which is an integral multiple of said fundamental period corresponding to an integral part of said reset-side added data, and fine delay means for delaying the output pulse from said reset-side logical delay means by a time interval shorter than said fundamental period corresponding to a fractional part of said reset-side added data.

4. A timing generator for IC testers which is provided for each pin of an IC device under test, comprising:

a memory which stores an integral part of timing set data expressed in terms of a fundamental period, set-side added data obtained by adding a fractional part of said timing set data and data generated at a post-stage of said timing generator for compensating for set-side propagation delay variations, and a reset-side added data obtained by adding said fractional part of said timing set data and data generated at said post-stage of said timing generator for compensating for reset-side propagation delay variations, said memory being read every test cycle;

coarse timing generating means supplied with said integral part of said timing set data read out of said memory, for generating pulses of a period which is an integral multiple of said fundamental period corresponding to said integral part;

set-side delay means for delaying the output pulse from said coarse timing generating means by set-side logical delay means by a time interval which is an integral multiple of said fundamental period corresponding to an integral part of said read-out set-side added data and for delaying the output pulse from said set-side logical delay means by fine delay means by a time interval shorter than said fundamental period corresponding to a fractional part of said read-out set-side added data;

reset-side delay means for delaying the output pulse from said coarse timing generating means by reset-side logical delay means by a time interval which is an integral multiple of said fundamental period corresponding to an integral part of said read-out reset-side added data and for delaying the output pulse from said reset-side logical delay means by fine delay means by a time interval shorter than said fundamental period corresponding to a fractional part of said read-out reset-side added data, and gate means which permits or inhibits the passage therethrough of the output pulse from said set-side delay means and the output pulse from said reset-side delay means under the control of the set- and reset-side outputs from a waveform generation control circuit.

5. The timing generator of claim 2 or 4, wherein said set-side logical delay means comprises a cascade connection of flip-flops for shift-control of the input pulse thereto by a clock pulse of said fundamental period, and a selector for selectively taking out one of the input to the first-stage of said cascade connection and the outputs from the respective stages thereof in accordance with said set-side added data; and wherein said reset-side logical delay means comprises a cascade connection of flip-flops for shift-control of the input pulse thereto by a clock pulse of said fundamental period, and a selector for selectively taking out one of the input to the first-stage of said cascade connection and the outputs from the respective stages thereof in accordance with said reset-side added data.

6. A timing generator for IC testers which is provided for each pin of an IC device under test, comprising:

a memory in which integral and fractional parts of timing set data expressed in terms of a fundamental period are stored and from which they are read out every test cycle;

coarse timing generating means supplied with said integral part of said read-out set data, for generating pulses of a period which is an integral multiple of said fundamental period corresponding to said integral part;

set-side delay means which adds together, by a set-side adder, said fractional part of said read-out timing set data and set-side propagation delay variation compensating data generated at a post-stage of said timing generator, delays the output pulse from said coarse timing generating means by set-side logical delay means by a time interval which is an integral multiple of said fundamental period corresponding to an integral part of said added output data, and delays the output pulse from said set-side logical delay means by fine delay means by a time interval corresponding to a fractional part of said added output data;

reset-side delay means which adds together, by a reset-side adder, said fractional part of said read-out timing set data and reset-side propagation delay variation compensating data generated at said post-stage of said timing generator, delays the output pulse from said coarse timing generating means by reset-side logical delay means by a time interval which is an integral multiple of said fundamental period corresponding to an integral part of said added output data, and delays the output pulse from said reset-side logical delay means by fine delay means by a time interval corresponding to a fractional part of said added output data; and gate means which is controlled by set- and reset-side outputs from a waveform generation control circuit to permit or inhibit the passage therethrough of the output pulse from said set-side delay means and the output pulse from said reset-side delay means.

7. The timing generator of claim 3 or 6, wherein said set-side logical delay means comprises a cascade connection of flip-flops for shift-control of the input pulse thereto by a clock pulse of said fundamental period, and a selector for selecting one of the input to the first stage of said cascade connection and outputs from respective stages thereof in accordance with a carry output from said set-side adder and an integral part of said set-side propagation delay variation compensating data; and wherein said reset-side logical delay means comprises a cascade connection of flip-flops for shift-control of the input pulse thereto by a clock pulse of said fundamental period, and a selector for selecting one of the input to the first stage of said cascade connection and outputs from respective stages thereof in accordance with a carry output from said reset-side adder and an integral part of said reset-side propagation delay variation compensating data.

* * * * *